(12) United States Patent
Spady et al.

(10) Patent No.: US 6,836,690 B1
(45) Date of Patent: Dec. 28, 2004

(54) HIGH PRECISION SUBSTRATE PREALIGNER

(75) Inventors: Blaine R. Spady, Lincoln, NE (US); William A. McGahan, Spicewood, TX (US); James V. Read, Austin, TX (US); Arosha W. Goonesekera, Lincoln, NE (US); Eric A. Rost, Lincoln, NE (US)

(73) Assignee: Nanometrics Incorporated, Milpitas, CA (US)

( * ) Notice: Subject to any disclaimer, the term of this patent is extended or adjusted under 35 U.S.C. 154(b) by 171 days.

(21) Appl. No.: 10/199,278

(22) Filed: Jul. 19, 2002

(51) Int. Cl.$^7$ .............................................. H01L 21/66
(52) U.S. Cl. ..................................... 700/108; 702/150
(58) Field of Search .................. 702/150, 85; 700/108, 700/218; 355/53; 340/426

(56) References Cited

U.S. PATENT DOCUMENTS

| | | | |
|---|---|---|---|
| 4,457,664 A | 7/1984 | Judell et al. ................ 414/779 |
| 5,238,354 A | 8/1993 | Volovich ..................... 414/779 |
| 5,438,209 A | 8/1995 | Yamamoto et al. .... 250/559.29 |
| 5,511,934 A | 4/1996 | Bacchi et al. ............... 414/783 |
| 5,513,948 A | 5/1996 | Bacchi et al. ............... 414/783 |
| 5,706,201 A | * 1/1998 | Andrews ..................... 700/108 |
| 5,982,474 A | * 11/1999 | Akiyama et al. ............. 355/53 |
| 6,038,029 A | 3/2000 | Finarov ....................... 356/399 |
| 6,085,125 A | * 7/2000 | Genov ......................... 700/218 |
| 6,320,609 B1 | 11/2001 | Buchanan et al. .......... 348/126 |
| 6,426,502 B1 | 7/2002 | Finarov ....................... 250/348 |
| 6,544,805 B2 | 4/2003 | Holcman et al. ............. 438/14 |
| 2001/0043858 A1 | 11/2001 | Bacchi et al. ............... 414/757 |
| 2002/0042153 A1 | 4/2002 | Holcman et al. ............. 438/14 |
| 2002/0048506 A1 | 4/2002 | Babbs et al. ................ 414/783 |
| 2002/0179841 A1 | 12/2002 | Finarov ....................... 250/348 |

* cited by examiner

Primary Examiner—John Barlow
Assistant Examiner—Victor J. Taylor
(74) Attorney, Agent, or Firm—Silicon Valley Patent Group LLP

(57) ABSTRACT

A prealigner includes a light source and light detector that detects the position of the periphery of a substrate as a rotary chuck rotates the substrate. The prealigner includes a processor that receives and records the peripheral position of the substrate relative to the angular position of the substrate. The prealigner determines the center of the substrate by fitting a curve to the recorded data set, after eliminating any spikes in the data, e.g., caused by the notch or parts of the chuck. The center may then be easily and accurately determined using the amplitude and phase of the fitted curve. The position of the notch is determined by fitting a curve to the data set for the notch and determining the derivative of the curve. The mid-point of the notch and the offset error of the apex of the notch from the mid-point are calculated based on the derivative.

47 Claims, 7 Drawing Sheets

HIGH PRECISION SUBSTRATE PREALIGNER

BACKGROUND OF THE INVENTION

1. Field of the Invention

The present invention relates to prealigners used to align a substrate prior to processing or testing and, in particular, to a high precision prealigner.

2. Discussion of the Related Art

In processing and measurement of semiconductor devices, the precise knowledge of the position, i.e., the center and orientation, of a substrate is often required. Prealigners are used to precisely position and orient articles in automated processing and metrology systems. For example, a prealigner can be used to align substrates, such as semiconductor wafers, for testing or processing during the manufacture of integrated circuits. Of course, prealigners may be useful in other industries in which the position of a substrate must be strictly controlled.

Current prealignment systems use a light source and corresponding detector to scan the periphery of a substrate while the substrate is rotated about an axis perpendicular to the plane of the substrate. Typically, the light source and detector used in prealignment systems are expensive and bulky components. Conventional prealignment systems determine the orientation of the substrate prior to loading the substrate on the processing or metrology stage. Once the center and orientation of the substrate is properly aligned, the system loads the substrate onto the processing or metrology stage.

SUMMARY

In accordance with an embodiment of the present invention, a substrate is loaded on a rotary chuck and a prealigner locates the center of a substrate by performing an initial scan of the periphery of the substrate to generate an initial data set and analyzing the initial data set to determine the coarse position of the notch and the center offset of the substrate relative to the axis of rotation of the rotary chuck that the substrate is loaded on. The initial data set is curve fitted and the amplitude and phase of the curve are used to calculate the center offset. The prealigner also locates the apex of the notch by scanning a portion of the periphery of the substrate that includes the notch to generate a data set of the notch. The second data set is curve fitted and a derivative of the curve is generated. Using the derivative of the curve, e.g., the peaks on the derivative curve, the mid-point of the notch can be located and the offset error of the apex of the notch from the mid-point of the notch. The location of the apex of the notch can then be accurately determined using the calculated mid-point and offset error.

In another embodiment of the present invention, an apparatus includes a rotary chuck that holds a substrate by the periphery of the substrate and a prealigner system. The prealigner system includes a light source for producing light that will be at least partially incident on the periphery of the substrate and a light detector positioned to detect the light. The light detector converts the detected light to an output signal, which is received by a processor coupled to the light detector. The processor records the output signal of the light detector relative to the angular position of the substrate.

In one embodiment the prealigner further includes a computer program that is executed by the processor. The computer program includes instructions for fitting a curve to the data set of the recorded output signals of the light detector relative to the angular position of the substrate and for determining the derivative of the curve. The computer program also includes instructions for calculating the location of the apex of the notch using the derivative of the curve. In another embodiment, the computer program includes instructions for fitting a curve to the data set of the recorded output signals of said light detector relative to the angular position of said substrate determining the center offset of said substrate relative to said axis of rotation of said rotary chuck using the curve fitted to the data set.

DETAILED DESCRIPTION

Figure 1:
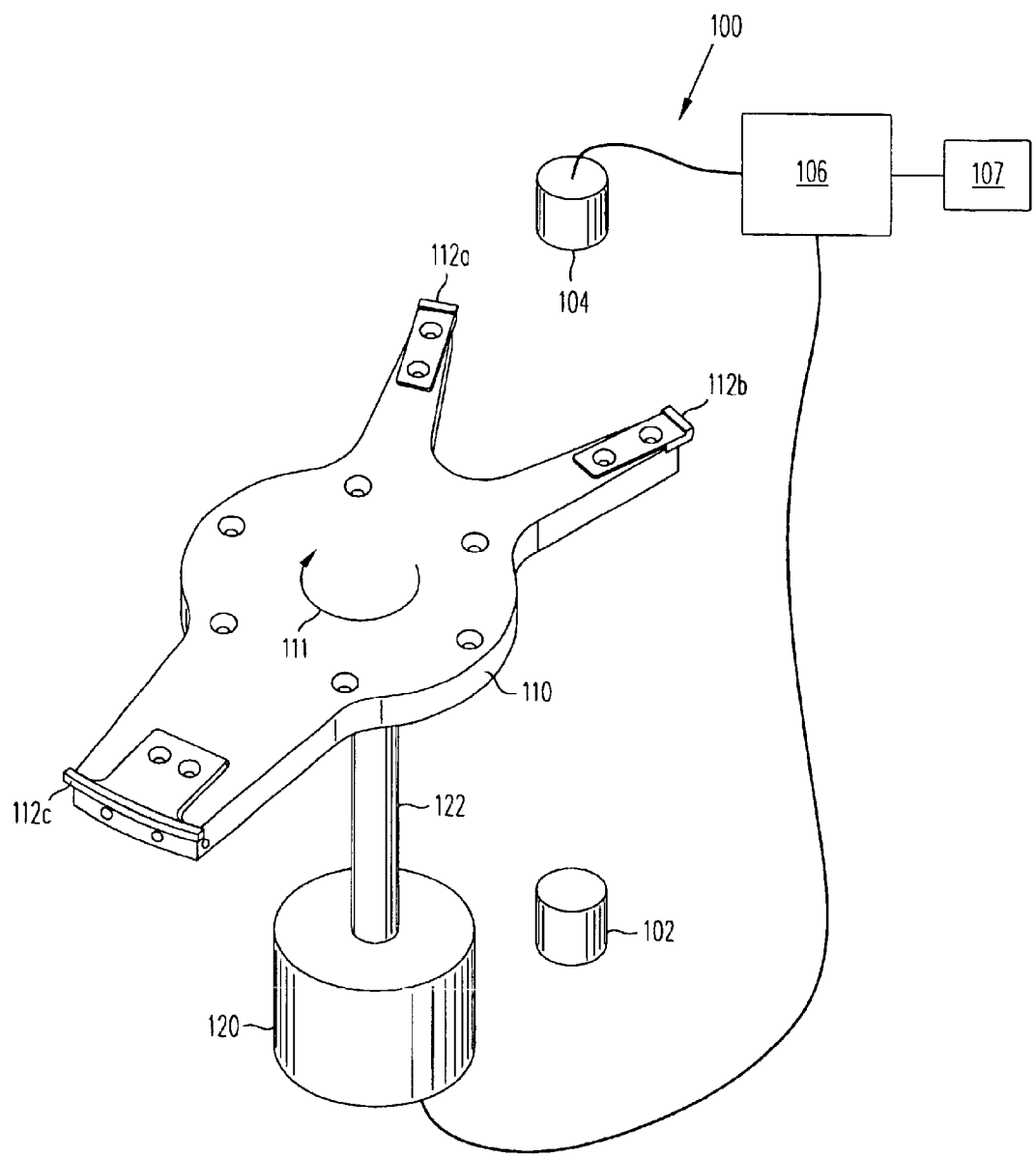
FIG. 1 shows in perspective view a prealigner with a rotary stage.

FIG. 1 shows in perspective view a prealigner 100 along with a rotary stage 110, illustrated as an actuated edge grip chuck. Prealigner 100 includes a light source 102, which may be, e.g., a light emitting diode, laser diode, laser, or other appropriate source, and a light detector 104, which may be, e.g., a photodiode. The light source 102 may be, e.g., an 880 nm light emitting diode manufactured as part number L2791-02 from Hamamatsu, that produces an infrared collimated light beam. The light detector may be, e.g., a high speed (500 MHz) A Si-PIN photodiode for visible to near infrared light detection with a detector active area diameter of 1.2 nm, manufactured as part number S5971 from Hamamatsu. Detector 104 is coupled to a processor 106 through appropriate circuitry, e.g., through an amplifier. The processor 106 analyzes the data provided by the detector 104. Memory 107 is coupled to processor 106 (or may be part of processor 106, e.g., as a hard drive or RAM) and is used to record the data provided by the detector 104, as well as results of the analysis of processor 106. Processor 106 and memory 107 will sometimes be referred to herein as simply processor 106.

The rotary stage 110 holds a substrate (not shown in FIG. 1), such as a silicon wafer, a flat panel display or other substrate to be processed or tested. The rotary stage 110 is coupled to a rotary motor 120, e.g., via shaft 122. Rotary motor 120 is controlled by a control system, which may be processor 106, to rotate the substrate in a controlled manner, as illustrated by arrow 111, while prealigner 100 scans the periphery of the substrate.

As shown in FIG. 1, rotary stage 110 may be an edge grip chuck, which holds the substrate by the periphery using tabs 112*a*, 112*b*, and 112*c*. For example, the tab 112*c* may be biased closed to hold a substrate and actuated by a piezoelectric actuator to open, while tabs 112*a* and 112*b* are held stationary. For more information on an edge grip chuck, see the U.S. Patent Application entitled "Edge Grip Chuck", by Blaine R. Spady et al., having Ser. No. 10/198,948, filed herewith, which has the same assignee as the present disclosure, and which is incorporated herein by reference. Of course, the rotary stage 110 may use other types of chucks that allow the edge of the substrate to be viewed by the prealigner 110.

Figure 2:
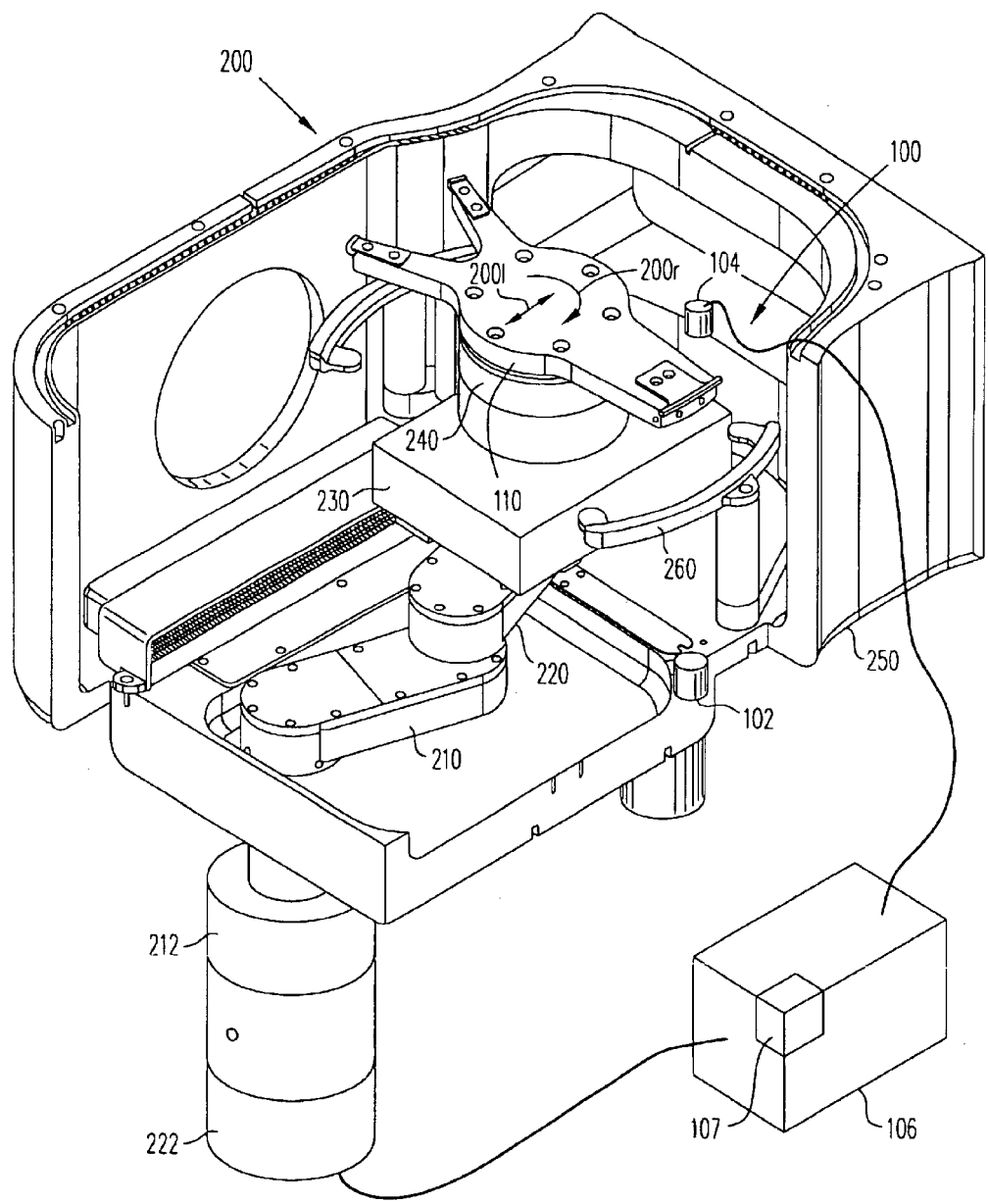
FIG. 2 shows a perspective view of prealigner integrated into a metrology system.

FIG. 2 shows a perspective view of prealigner 100 integrated into a metrology system. FIG. 2 shows a stage 200 positioned within a chamber 250 along with prealigner 100 (the sidewalls and ceiling of chamber 250 are missing in FIG. 2 for clarity). The integration of prealigner 100 with the stage 200 advantageously reduces cost and space because a separate rotary stage and control system is not necessary for prealigner 100.

Because the edge grip chuck holds the substrate by the periphery, the periphery of any substrate held by the chuck will be in approximately the same position. Accordingly, the light detector 104 used in prealigner 100 may be a single photodiode, which is approximately 1 mm in diameter. Of course, if other types of chucks are used, larger phododiodes or an array of photodiodes may be used.

As discussed above, the prealigner 100 can use simple and inexpensive components, e.g., a light emitting diode and a photodiode, for the source 102 and detector 104. Accordingly, the prealigner 100 is cost effective. Moreover, the use of a light emitting diode avoids safety issues associated with the use of a laser. Further, the small size of such components permits easy integration into metrology and processing system.

As shown in FIG. 2, stage 200 includes a number of arms 210 and 220 and motors 212 and 222 that are controlled by an appropriate control system, e.g., processor 106. The motors 212, 222 and arms 210 and 220 move the chuck 110 in a linear direction and a rotational direction, illustrated by arrows 200l and 200r, respectively. The stage 200 further includes a Z stage actuator 230 and a theta housing 240 to which chuck 110 is mounted. Stage 200 U.S. is described in detail in the U.S. Patent Application entitled "Precision Polar Coordinate Stage", by Christopher W. Blaufus et al., having Ser. No. 10/199,140, filed herewith, which has the same assignee as the present disclosure, and which is incorporated herein by reference. It should be understood that FIG. 2 only provides an example of a stage system with which prealigner 100 may be used. If desired, prealigner 100 may be used with any stage systems that include rotary and linear motion, which are well known in the art.

The light source 102 of prealigner 100 may be located in the ceiling of the chamber in which the stage is located (the ceiling is not shown in FIG. 2) while the detector 104 is located in the floor of the chamber. Of course if desired, the positions of the light source 102 and detector 104 may be reversed. In use, after the substrate is loaded onto the chuck 110, the chuck 202 rotates the substrate.

Figure 3:
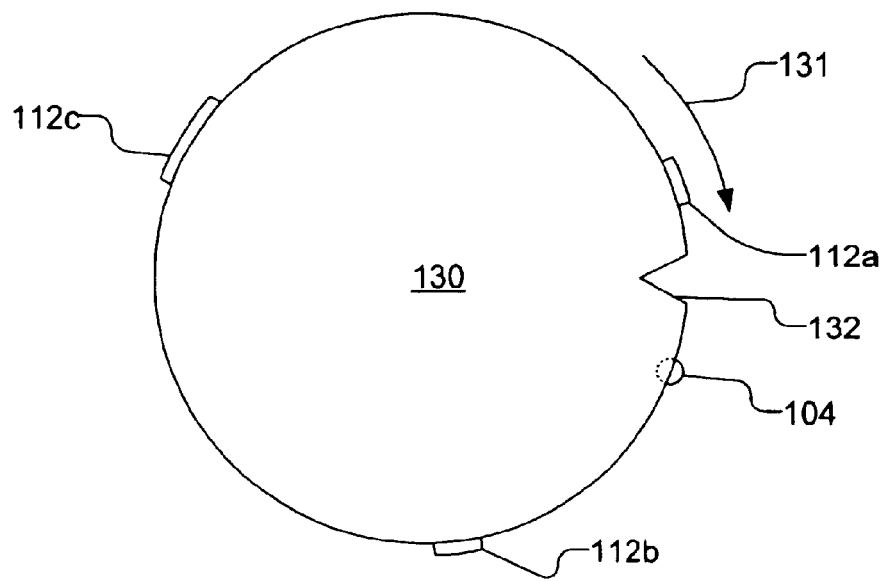
FIG. 3 shows a plan view of a substrate with a notch and a light detector of the prealigner.

FIG. 3 shows a plan view of a substrate 130 with a notch 132. The substrate 130 is held by rotary stage 110 (only tabs 112*a*, 112*b*, and 112*c* are shown in FIG. 3) over light detector 104, which is ideally aligned with the periphery of the substrate 130. As the substrate 130 is rotated by rotary stage 110, as indicated by arrow 131, the light source 102 produces light that is at least partially incident on the periphery of the substrate 130. The detector 104 detects the light and converts the detected light into an output signal. The output signal from detector 104 is recorded, e.g., at 4 KHz, versus the angular position of the substrate 130. It should be understood that the output signal from detector 104 may be a voltage or current signal, but will be assumed to be a voltage signal herein.

An initial calibration of the sensitivity of the detector 104 is required to linearize the voltage output signal of the detector 104. To calibrate the detector 104, a knife edge is stepped across the detector 104, e.g., 20 $\mu$m at a time, from fully illuminated to fully occluded. At each step, the light detector 104 output voltage versus the position of the knife edge is recorded. During a measurement of a substrate, the output signal produced by the light detector 104 can then be linearized using the calibration data. It should be understood that by stepping the knife edge by a smaller amount, the linearized resolution of the prealigner 100 may be improved.

Figure 4:
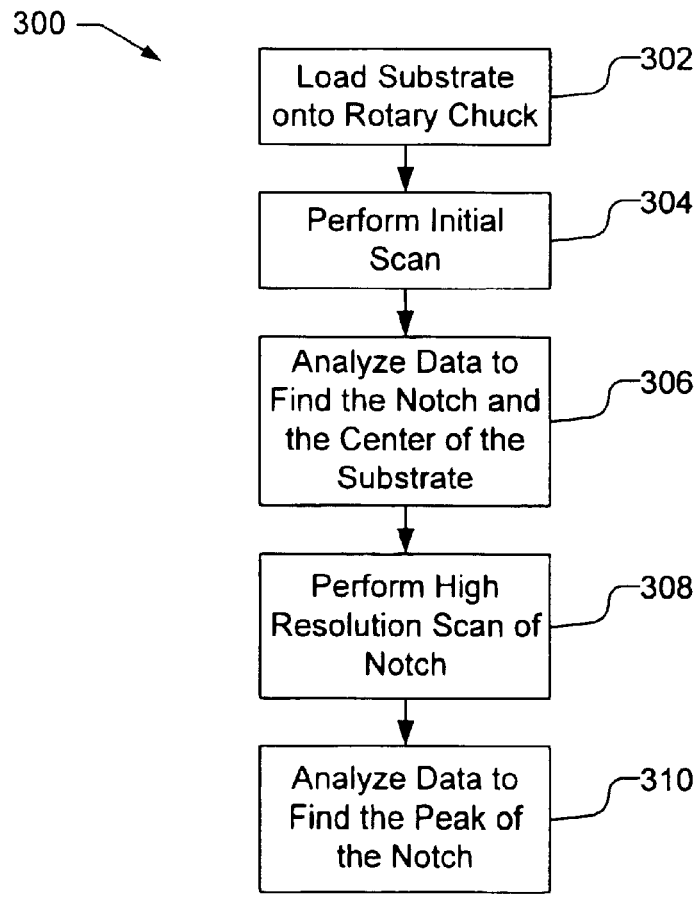
FIG. 4 shows a flow chart of the operation of the prealigner in accordance with an embodiment of the present invention.

FIG. 4 shows a flow chart 300 of the operation of prealigner 100 in accordance with an embodiment of the present invention. The operation of the prealigner 100 is controlled by processor 106, which executes a computer program that includes appropriate instructions. A computer program with appropriate instructions may be easily written by one skilled in the art in light of the present disclosure.

During operation, a substrate 130 is loaded onto the rotary stage 110 (block 302). Two separate scans are performed by prealigner to generate two sets of data. First, an initial scan is performed (block 304), in which the substrate 130 is rotated by rotary stage 110 a full 360 degrees. During the initial scan, the light detector voltage output versus the rotational angle is recorded by processor 106 and memory 107 (shown in FIGS. 1 and 2). In other words, the initial scan produces a data set representing the peripheral edge position versus the angular position of the substrate. The first set of data recorded during the initial scan is then analyzed by the processor 106 to detect a coarse position of the notch 132 and to find the center of the substrate 130 (block 306). Once the coarse position of the notch and the center of the substrate are determined, a high resolution scan of the notch 132 is performed (block 308), i.e., the notch 132 plus a few degrees on either side of the notch 132 are scanned. There is no need to do a full rotation of the substrate 130 during the high resolution scan. The set of data recorded during the high resolution scan is then analyzed by the processor 106 to find the apex of the notch 132 to orient the centered substrate 130 based on the apex of the notch 132 (block 310).

In one embodiment, the initial scan and high resolution scan are performed at the same time, i.e., only one scan is performed during which the substrate is rotated 360 degrees. The data from the single scan is then analyzed to determine the center of the substrate (similar to block 306) and to determine the apex of the notch 132 (similar to block 310).

Figure 5:
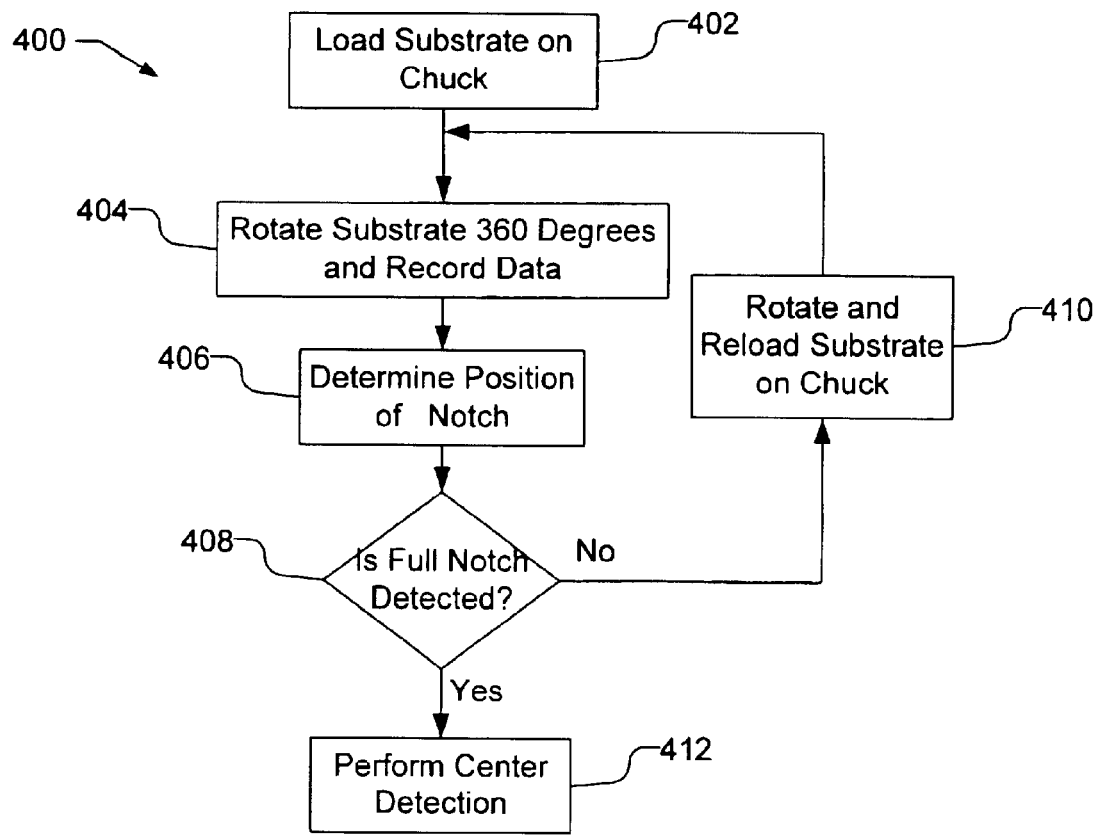
FIG. 5 is a flow chart of the initial scan and analysis in accordance with an embodiment of the present invention.

FIG. 5 is a flow chart 400 of the initial scan and analysis of blocks 302, 304, and 306 in FIG. 4. As can be seen in FIG. 5, the substrate 130 is loaded onto the chuck 110 (block 402). The rotary stage 110 rotates the substrate 130 360 degrees while prealigner 100 scans and processor 106 records the data. The resolution of the initial scan is e.g., approximately one data point per 0.2 degrees. The data points may not be linearly spread over the 360 degrees of the scan due to acceleration and deceleration in the rotation of the chuck. The non-linearity of the data however, is minimal and does not affect the analysis.

Figure 6:
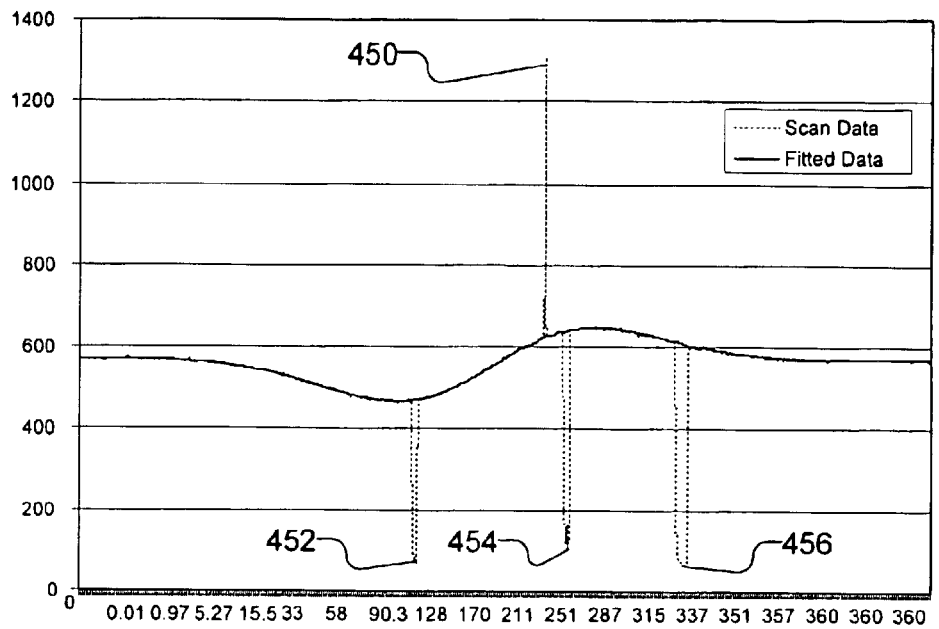
FIG. 6 is a graph that illustrates a scan of a substrate, where the X axis represents angular position, and the Y axis represents the linearized data in microns.

FIG. 6 is a graph that illustrates a scan of a substrate, where the X axis represents angular position, and the Y axis represents the linearized data in microns. FIG. 6 shows the linearized data with a dotted line and a curve fitted data with a solid line (curve fitting the data will be described in more detail below). As can be seen in FIG. 6, the initial scan produces data that can be approximated as a sine wave. Peaks 450, 452, 454, and 456 on the data represent the notch 132 and points on the rotary stage 110 that are observed by the prealignment system, i.e., tabs 112a, 112b, and 112c, respectively.

Referring back to flow chart 400, the coarse position of the notch 132, e.g., peak 450 in FIG. 6, is determined by scanning the data. The approximate angle of the notch 132 is stored for later use in the high resolution scan. When rotary stage 110 is an edge grip chuck or any other type of chuck that includes a portion that may obscure the notch 132, it must be determined if the notch 132 is represented in its entirety in the scanned data, i.e., is the full notch detected (block 408). To determine if the notch 132 is entirely visible to prealigner 100, the average values of several data points, e.g., five data points, on either side of the peak 450 that represents the notch 132 are examined to determine if one of the tabs is near the notch 132.

If the average values of the data on either side of the peak 450 represent a portion of the chuck, the notch is deemed incomplete. The substrate 130 is then unloaded from the rotary stage 110 rotated and reloaded onto the rotary stage 110 (block 410). With the edge grip chuck shown in FIG. 1, for example, the substrate 130 is rotated 180 degrees and reloaded onto the rotary stage 110. It should be understood that the rotation of the substrate 130 is relative to the rotary stage 110. Thus, for example, the rotary stage 110 may rotate 180 degrees prior to reloading the substrate 130. Of course, the amount of relative rotation between the substrate 130 and the rotary stage depends on the configuration of rotary stages and thus need not be 180 degrees. Once the substrate is reloaded onto the rotary stage 110, the initial scan and analysis must be performed again, i.e., the process flows back to block 404.

If the average values of the data on either side of the peak 450 do not represent a portion of the chuck, the notch is deemed to be fully detected and the center detection is then performed (block 412). Of course, if the rotary stage 110 has a configuration that would not obscure the notch 132, the process can skip blocks 408 and 410.

Figure 7:
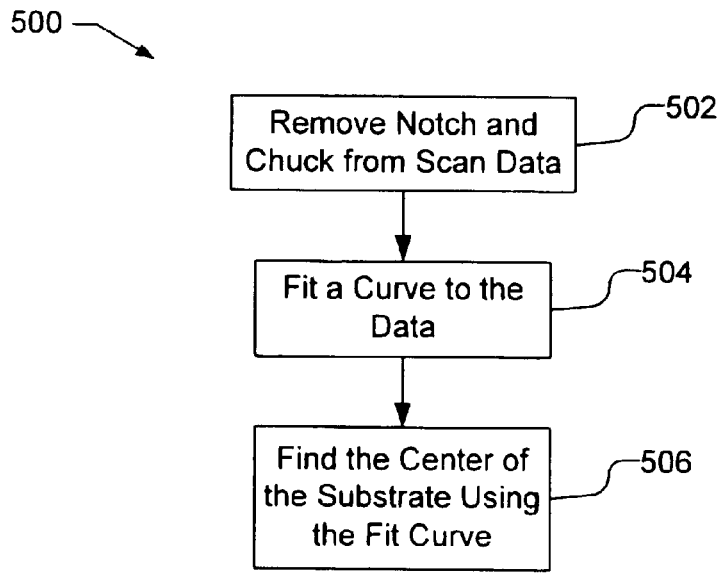
FIG. 7 is a flow chart of the center detection process.

FIG. 7 is a flow chart 500 of the center detection process. The center of the substrate 130 will have an offset from the axis of rotation of the stage 110, unless the center of the substrate 130 coincides with the axis of rotation of the stage 110. The center offset may be determined using a curve fitting process for the scanned data that represents the periphery of the substrate 130. The scanned data that represents the notch 132 and the tabs 112a, 112b, and 112c must be removed from the data. As shown in FIG. 6, the scanned data that represents the notch and tabs forms peaks 450, 452, 454, and 456. The peaks in the scanned data can be easily located by scanning through the data. For example, a peak may be located by comparing each data point with a previous data point to determine if the change exceeds a predetermined threshold. Data points that exceed this threshold represent peaks. The peaks in the scanned data are then removed and replacement data points are interpolated from the beginning to the end of each peak (block 502). The data points may be interpolated, e.g., simply by connecting the beginning and ending of the feature with an un-curved line. A curve is then fit to the processed data using a regression algorithm (block 504), for example, the Levenberg-Marquart regression technique. The curve fit advantageously eliminates noise in the scanned data as well as errors introduced by the interpolations of points. The fitted data is shown in FIG. 6 as a solid line.

The regression algorithm may describe the curve using the following equation:

$$a*\sin(f*x+p)+c, \quad \text{eq. 1}$$

where a is the amplitude of the curve, f is the frequency, p is the phase and c is a constant offset from 0, and x is the angular position. The regression algorithm alters only the a, f and p parameters. Once a curve is fit to the data, the amplitude a and phase p are used to determine the center of the substrate as follows:

$$X_{offset}=a*\cos(\Phi)*10^{-3}; \quad \text{eq. 2}$$

$$X_{offset}=a*\cos(\Phi)*10^{-3}; \quad \text{eq. 3}$$

where:

$$\Phi=Mod((450-\theta_{valley}),360). \quad \text{eq. 4}$$

where $\theta_{valley}$ is the angular position of the minima of the fitted curve and is dependent on the phase p of the wave.

Using equations 2, 3, and 4, the offset of the center of the substrate 130 from the rotational axis of the stage 110 is determined (block 506). The $X_{offset}$ and $Y_{offset}$ are relative to the substrate 130 when the stage 110 is at a predetermined position, e.g., the zero degrees rotation on FIG. 6. The center offset can be fed back into the control system, e.g., processor 106 in FIG. 2, as a correction vector using well known system coordinate transformations, e.g., using a matrix formulation. The substrate is then effectively centered on the stage by transforming the substrate's coordinate system to a corrected coordinate system. Thus, the coordinates of any desired position on the substrate 130 are modified using the correction vector to effectively center the substrate. Accordingly, the substrate is effectively centered without requiring additional steps of moving the substrate relative to the stage as is conventionally done.

Figure 8:
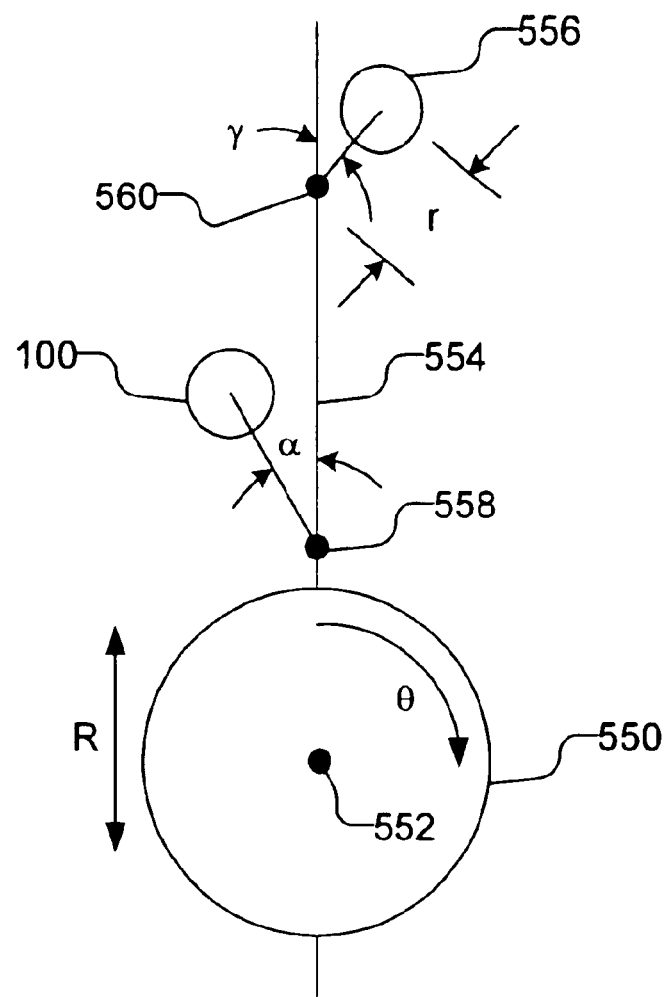
FIG. 8 is a schematic view showing the relative positions of the linear axis of a polar coordinate stage and a prealigner and metrology optics.

Additional correction vectors may also be used with the system. For example, if the prealigner 100 is not directly over the linear axis of the stage 110, a correction vector for the angle between the linear axis of the stage and the prealigner may be used. Additionally, if the stage is used with a metrology tool, a correction vector may be needed for any misalignment of the optics. For example, there may be misalignment between the optics and the axis of rotation of the stage. FIG. 8 is a schematic view of a polar coordinate stage 550 (having an axis of rotation 552 and linear axis 554) with a prealigner 100 and metrology optics 556. Both the prealigner 100 and metrology optics 556 are off the linear axis 554 of the stage 550. The prealigner 100 is offset from the linear axis 554 by an angle a, where the point 558 represents the location of the axis of rotation 552 of the stage 550 during prealignment. To measure the angle α, a substrate may be prealigned as described herein to determine the location of the notch. The substrate is then positioned under the metrology optics 556 and the notch is located. The difference in angular position of the stage 550 is the pre-aligner angle α.

Also shown in FIG. 8, the metrology optics 556 are offset from the desired position 560 by an angle γ and an amount r. Of course, the optics offset may be measured in Cartesian coordinates, i.e., X and Y, if desired. The offset of the metrology optics 556 can be determined by placing the axis of rotation 552 of the stage 550 on the desired position 560. A marking on the axis of rotation 552 of the stage 550 can then be used to measure the offset from the center of the optics 556, e.g., through the use of pattern recognition or other techniques.

The correction vector used to modify the coordinates of any position on the substrate to a corrected position may include the optics offset, i.e., angle γ and r, the prealigner angle α, as well as the center offset $X_{offset}$ and $Y_{offset}$. It should be understood that the substrate position coordinates and the correction vector may be transformed between any desired coordinate system, e.g., polar or Cartesian.

Of course, if desired, the substrate 130 may be physically centered on a stage by lifting the substrate 130, e.g., using a robot arm or a substrate lift mechanism 260 shown in FIG. 2, and moving the stage by an amount determined by the correction vector (after appropriate conversion from Cartesian coordinates to polar coordinates. The substrate 130 is then returned to the stage 10 in a centered position. This embodiment is particularly useful when the substrate is not held by the edge. Of course, if the stage has the capability to move in Cartesian coordinates, i.e., in the X and Y direction, along with rotary motion, the center offset vector may simply be used to redefine the center of rotation of the stage 110, i.e., physically moving the stage to compensate for the offset.

The use of curve fitting on the scanned data results in extremely precise results. For example, the substrate center is found to within a few microns, while conventional systems have a precision of approximately 100 microns.

Figure 9:
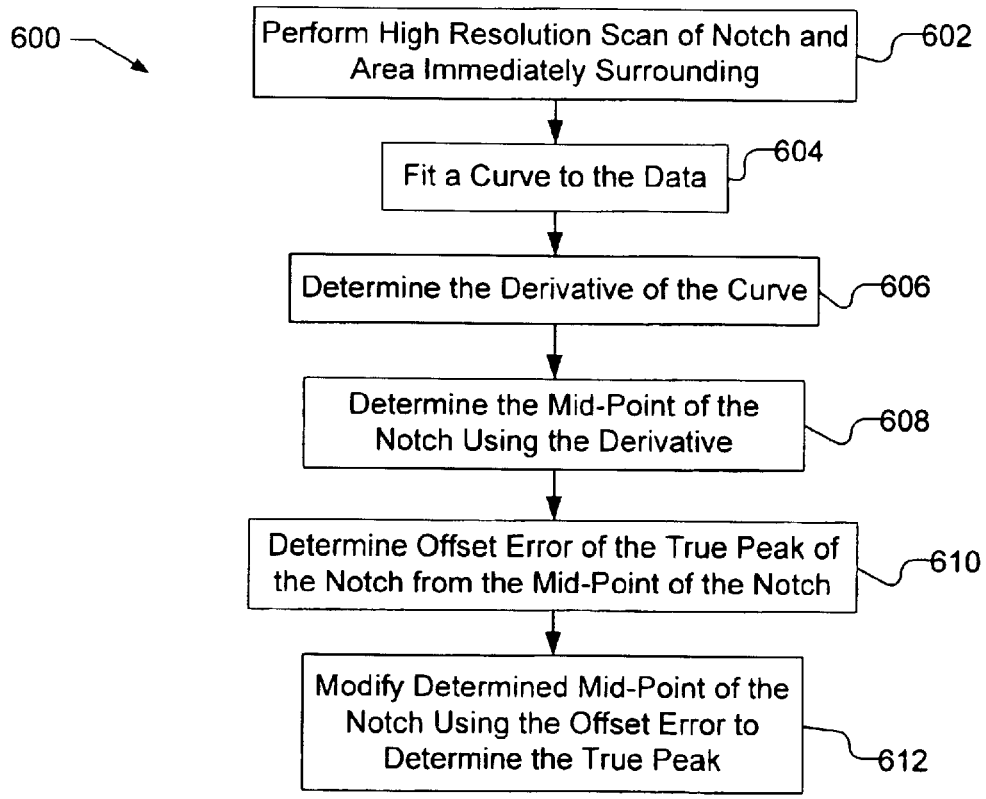
FIG. 9 is a flow chart of the notch center detection process.

With the substrate 130 centered on the stage 110 and the coarse position of the notch 132 determined, the center of the notch can be found. FIG. 9 is a flow chart 600 of the notch center detection process. A high resolution scan of the notch 132 and area immediately surrounding the notch is performed (block 602), e.g., approximately 1.5 mm on each side of the notch 132. The entire high resolution scan may be, e.g., 6 degrees.

Figure 10:
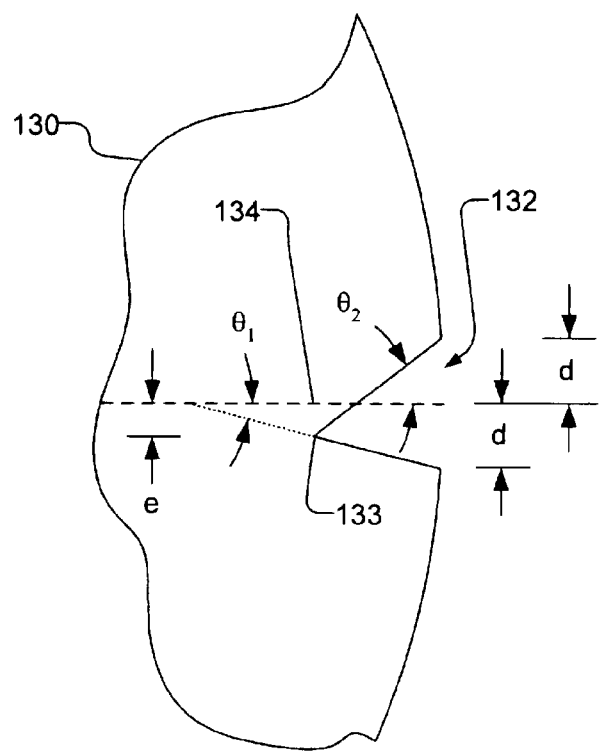
FIG. 10 shows a top view of a section of the substrate with an asymmetric notch.

In order to precisely determine the location of notch 132, the noise in the scanned data must be eliminated and the true apex of the notch must be determined, not simply the mid-point of the notch. By way of example, FIG. 10 shows a top view of a section of substrate 130 with notch 132, where the dotted line 134 represents the radius of substrate 130 taken from the mid-point of the notch 132, i.e., a distance d from where the notch 132 begins and ends. Typically, notches in substrates are slightly skewed as shown greatly exaggerated in FIG. 10. Thus, the true apex 133 of the notch 132 does not coincide with the mid-point of the notch 132. As shown in FIG. 10, the true apex 133 of the notch 132 has an offset error e from the mid-point of the notch 132.

To determine the precise location of the true apex 133 of the notch, a curve, e.g., a third order polynomial, is then fit to the data generated in the high resolution scan (block 604 in FIG. 9) and the derivative of the curve is determined (block 606). The derivative of the curve will be used to determine the mid-point of the notch 132 and the offset error e as described below. If desired, fitting the curve and determining the derivative may be performed in a single step.

Figure 11:
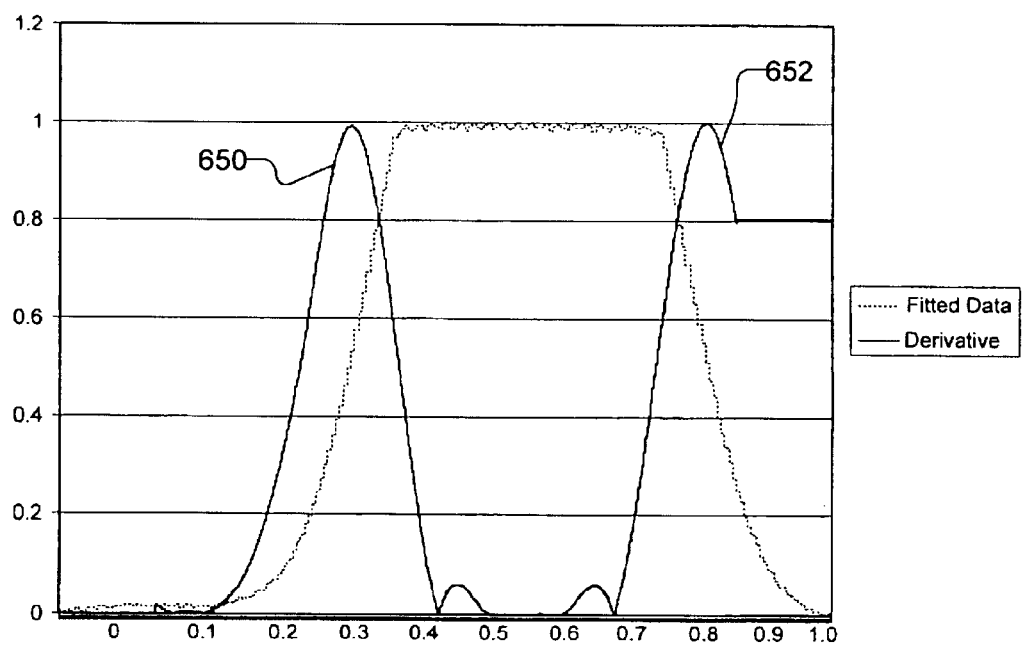
FIG. 11 is a graph that illustrates the high resolution scan of a notch, where the X axis represent angular position, and the Y axis represents the linearized voltage output of the detector.

FIG. 11 is a graph that illustrates the high resolution scan of a notch, where the X axis represent angular position, and the Y axis represents the linearized voltage output of the detector 104. A scaling factor has been applied to the X axis to scale the angular position between 0 and 1. Likewise, a scaling factor has been applied to the Y axis to scale the linearized voltage output of the detector 104 between 0 and 1. FIG. 11 shows the curve fitted data with a dotted line and the derivative of the curve fitted data with a solid line.

As can be seen in FIG. 11, the derivative of the curved data has two peaks 650 and 652, one on each side of the maximum of the fitted data. The derivative of the curve fitted data tracks trends in the data Thus, for example, the peaks 650 and 652 of the derivative mark where there is a large change in slope, i.e., the beginning and ending of the notch. The mid-point MP of the notch 132, thus, can be determined as the mid-point of the two derivative peaks (block 608), i.e., $$x1 + \left(\frac{x1 - x2}{2}\right) = MP \qquad \text{eq. 5}$$

where x1 is the X position of the first derivative peak 650 and x2 is the X position of the second derivative peak 652 along the X axis of FIG. 11. The derivative curve levels off after peak 652, in FIG. 11, due to the derivative algorithm, but this does not affect the analysis.

The offset error e of the true apex 133 from the mid-point of the notch 132 is then determined (block 610). As can be seen in FIG. 10, the asymmetry of the notch 132 results in one side of the notch being steeper than the other side, i.e., $\theta_1$ is not equal to $\theta_2$. The asymmetry in the steepness of the sides of the notch 132 results in the amplitudes of the peaks of the derivative shown in FIG. 11 being unequal. To determine the offset error e of the true apex 133 from the mid-point of the notch, the difference δP in the amplitudes of the derivative peaks 650 and 652 is calculated as follows:

$$P1 - P2 = \delta P \qquad \text{eq. 6}$$

where P1 is the amplitude of the first peak 650, P2 is the amplitude of the second peak 652 along the X axis of FIG. 11. The difference in amplitude δP is then multiplied by a constant C to obtain the offset error e of the true apex:

$$\delta P * C = e. \qquad \text{eq. 7}$$

The constant C is an empirical constant that brings the calculated offset error e closer to what is observed experimentally. It has been found that the scaling factor for the X axis of FIG. 11, i.e., the factor that scales the angular position between 0 and 1, is a good choice for the constant C.

Once the offset error e is determined, the mid-point MP of the notch is modified with the offset error e to determine the position of the true apex $x_{TP}$ on the X axis of FIG. 11 (block 612), i.e., $$MP - e = x_{TP}. \qquad \text{eq. 8}$$

The true apex position $x_{TP}$ can then be scaled back to the angular position of the substrate 130. If desired, the center correction vector, e.g., determined in block 506, may be used to correct the coordinates of the apex of the notch.

Advantageously, using the derivative to find the mid-point of the notch and the offset error provides a measurement that is more accurate than simply scanning the raw data for the high point because there are a finite number of data points and it is not likely that one of them will happen to fall on the true apex of the notch. Moreover, as illustrated in FIG. 11, the raw data may have more than one high point.

The present invention locates the apex of the notch to within <10 arc-seconds, while conventional systems have a precision of approximately 50 arc-seconds. The increased precision of the prealignment is advantageous as it allows more precise measurements on unpatterned substrates and increases reliability of pattern recognition of patterned substrates, i.e., the pattern recognition system only has to compensate for small errors.

In addition to being more accurate than conventional systems, the prealigner 100 is also faster conventional systems. Prealigner 100 can align a substrate in approximately 2 seconds, while conventional prealignment systems take approximately 6 seconds. Data may be taken from a photodiode detector 104 at approximately 4 KHz, which will provide a few thousand data points to process to curve fit, while still providing a fast prealignment.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, various process steps may be combined or performed separately. Thus, the spirit and scope of the appended claims should not be limited to the foregoing description.

What is claimed is:

1. A method comprising:
    loading a substrate having a notch onto a rotary chuck having an axis of rotation;
    performing an initial scan of the periphery of said substrate to generate an initial data set;
    analyzing said initial data set to determine the position of said notch and to find the center offset of said substrate relative to said axis of rotation of said rotary chuck;
    performing a second scan of a portion of the periphery of said substrate that includes said notch to generate a secondary data set; and
    analyzing said secondary data set to find the apex of said notch.

2. The method of claim 1, performing an initial scan of the periphery of said substrate to generate an initial data set comprises:
    rotating said substrate;
    producing light that is at least partially incident on said periphery of said substrate as said substrate rotates;
    detecting said light and converting the detected light to an output signal; and
    recording the output signal versus the angular position of said substrate.

3. The method of claim 2, further comprising linearizing said output signal.

4. The method of claim 1, further comprising:
    determining if said initial data set includes data representing the entire notch; and
    reloading said substrate on said rotary chuck with a different angular orientation relative to said rotary chuck if said initial data set does not include data representing the entire notch.

5. The method of claim 1, wherein analyzing said initial data set to determine the position of said notch and to find the center offset comprises:
    fitting a curve to said initial data set; and
    determining said center offset using the fitted curve; and
    said method further comprising using said center offset as a correction vector when determining the coordinate of any position on said substrate.

6. The method of claim 5, further comprising eliminating data representing said notch from said initial data set and interpolating replacement data points before fitting a curve to said initial data set.

7. The method of claim 5, wherein determining said center offset using the fitted curve comprises using the amplitude and the phase of said fitted curve.

8. The method of claim 1, wherein performing a second scan of a portion of the periphery of said substrate that includes said notch to generate a secondary data set comprises:
    rotating said substrate;
    producing light that is at least partially incident on said periphery of said substrate as said substrate rotates;
    detecting said light and converting the detected light to an output signal; and
    recording the output signal versus the angular position of said substrate.

9. The method of claim 1, wherein analyzing said secondary data set to find the apex of said notch comprises:
    fitting a curve to said secondary set of data;
    determining the derivative of said curve;
    determining the location of the mid-point of said notch using said derivative;
    determining the offset error of said apex of said notch from said mid-point of said notch using said derivative; and
    determining the location of said apex of said notch using said location of said mid-point and said offset error.

10. The method of claim 9, wherein the curve fitted to said secondary set of data includes a curve fitted peak representing said notch and said derivative of said curve includes derivative curve peaks on both sides of the curve fitted peak, wherein determining the location of the mid-point of said notch using said derivative comprises calculating the mid-point between said derivative curve peaks.

11. The method of claim 10, wherein each of said derivative curve peaks has an amplitude, wherein determining the offset error of said apex of said notch from said mid-point of said notch using said derivative comprises calculating the difference in amplitudes of said derivative curve peaks.

12. The method of claim 11, wherein the amplitude of said derivative is scaled and said angular position of said substrate is scaled, said determining the offset error further comprises modifying said difference in amplitudes of said derivative curve peaks with the scaling factor for said angular position of said substrate.

13. The method of claim 1, wherein loading a substrate having a notch onto a rotary chuck having an axis of rotation comprises loading said substrate onto said rotary chuck and holding said substrate by the periphery.

14. The method of claim 1, further comprising correcting the position of said apex of said notch using said center offset.

15. A method comprising:
    loading a substrate having a notch onto a rotary chuck;
    performing a scan of the periphery of said substrate that includes said notch to generate a data set of the peripheral edge position versus the angular position of said substrate;

fitting a curve to said data set;
determining the derivative of said curve; and
calculating the location of the apex of said notch using said derivative of said curve.

16. The method of claim 15, wherein calculating the location of said notch comprises:
    determining the mid-point of said notch using said derivative of said curve;
    determining the offset error of said apex of said notch from said mid-point of said notch using said derivative of said curve; and
    calculating the location of said apex of said notch using said mid-point and said offset error.

17. The method of claim 16, wherein the curve fitted to said data set includes a peak representing said notch and said derivative of said curve includes peaks on both sides of the peak representing said notch, wherein determining the mid-point of said notch comprises calculating the mid-point between said peaks of said derivative curve.

18. The method of claim 17, wherein each of said peaks of said derivative curve has an amplitude, wherein determining the offset error of said apex of said notch comprises calculating the difference in amplitudes of said peaks of said derivative curve.

19. The method of claim 18, wherein the amplitude of said derivative is scaled and said angular position of said substrate is scaled, said determining the offset error further comprises modifying said difference in amplitudes of said peaks of said derivative curve with the scaling factor for said angular position of said substrate.

20. A method comprising:
    loading a substrate having a notch onto a rotary chuck having an axis of rotation;
    performing a scan of the periphery of said substrate that includes said notch to generate a data set of the peripheral edge position versus the angular position of said substrate;
    fitting a curve to said data set;
    determining the center offset of said substrate relative to said axis of rotation of said rotary chuck using the curve fitted to the data set; and
    determining the coordinate of a position on said substrate using said center offset as a correction vector.

21. The method of claim 20, further comprising eliminating data representing said notch from said data set and interpolating replacement data points before fitting a curve to said data set.

22. The method of claim 21, further comprising eliminating data representing said rotary chuck from said data set and interpolating replacement data points before fitting a curve to said data set.

23. The method of claim 20, wherein determining said center offset comprises using the amplitude and the phase of said fitted curve.

24. A method comprising:
    loading a substrate having a notch onto a rotary chuck having an axis of rotation;
    performing a scan of the periphery of said substrate that includes said notch to generate a data set of the peripheral edge position versus the angular position of said substrate;
    fitting a curve to said data set;
    determining the center offset of said substrate relative to said axis of rotation of said rotary chuck using the curve fitted to the data set;
    determining the derivative of said curve; and
    calculating the location of the apex of said notch using said derivative of said curve.

25. The method of claim 24, wherein calculating the location of the apex comprises:
    determining the mid-point of said notch using said derivative of said curve;
    determining the offset error of said apex of said notch from said mid-point of said notch using said derivative of said curve; and
    calculating the location of said apex of said notch using said mid-point and said offset error.

26. The method of claim 25, wherein determining the mid-point of said notch comprises calculating the mid-point between peaks on said derivative curve.

27. The method of claim 25, wherein determining the offset error of said apex of said notch comprises calculating the difference in amplitudes of peaks of said derivative curve.

28. The method of claim 24, further comprising scaling the amplitude and scaling the angular position of said derivative.

29. The method of claim 24, further comprising correcting the position of said apex of said notch using said center offset.

30. An apparatus comprising:
    a rotary chuck that holds a substrate by the periphery of said substrate, said rotary chuck having an axis of rotation;
    a prealigner system comprising:
        a light source for producing light that will be at least partially incident on said periphery of said substrate;
        a single element light detector positioned to detect said light, said light detector converts the detected light to an output signal; and
        a processor coupled to said light detector, said processor receiving and recording said output signal of said light detector relative to the angular position of said substrate.

31. The apparatus of claim 30, wherein said single element light detector is a photodiode.

32. The apparatus of claim 30, further comprising a computer program executed by said processor, wherein said computer program includes instructions for:
    fitting a curve to the data set of the recorded output signals of said light detector relative to the angular position of said substrate;
    determining the derivative of said curve; and
    calculating the location of the apex of said notch using said derivative of said curve.

33. The apparatus of claim 32, wherein the instructions for calculating the location of said notch include:
    determining the mid-point of said notch using said derivative of said curve;
    determining the offset error of said apex of said notch from said mid-point of said notch using said derivative of said curve; and
    calculating the location of said apex of said notch using said mid-point and said offset error.

34. The apparatus of claim 33, wherein the curve fitted to said data set includes a peak representing said notch and said derivative of said curve includes peaks on both sides of the peak representing said notch, wherein said instructions for determining the mid-point of said notch include calculating the mid-point between said peaks of said derivative curve.

35. The apparatus of claim 34, wherein each of said peaks of said derivative curve has an amplitude, wherein said instructions for determining the offset error of said apex of said notch comprises calculating the difference in amplitudes of said peaks of said derivative curve.

36. The apparatus of claim 35, wherein said computer program further includes instructions for:
scaling the amplitude of said derivative of said curve;
scaling said angular position of said substrate; and
wherein said instructions for determining the offset error further includes modifying said difference in amplitudes of said peaks of said derivative curve with the scaling factor for said angular position of said substrate.

37. The apparatus of claim 30, further comprising a computer program executed by said processor, wherein said computer program includes instructions for:
fitting a curve to the data set of the recorded output signals of said light detector relative to the angular position of said substrate; and
determining the center offset of said substrate relative to said axis of rotation of said rotary chuck using the curve fitted to the data set.

38. The apparatus of claim 37, wherein said computer program further includes instructions for:
eliminating data representing said notch from said data set and interpolating replacement data points before fitting a curve to said data set; and
eliminating data representing said rotary chuck from said data set and interpolating replacement data points before fitting a curve to said data set.

39. The apparatus of claim 37, wherein said instructions for determining the center offset comprises using the amplitude and the phase of said fitted curve.

40. An apparatus comprising:
a light source for producing light that will be at least partially incident on said periphery of said substrate;
a light detector positioned to detect said light, said light detector converts the detected light to an output signal;
a processor coupled to said light detector, said processor receiving and recording said output signal of said light detector relative to the angular position of said substrate; and
a computer program executed by said processor, wherein said computer program includes instructions for:
fitting a curve to the data set of the recorded output signals of said light detector relative to the angular position of said substrate;
determining the derivative of said curve; and
calculating the location of the apex of said notch using said derivative of said curve.

41. The apparatus of claim 40, wherein the instructions for calculating the location of said notch include:
determining the mid-point of said notch using said derivative of said curve;
determining the offset error of said apex of said notch from said mid-point of said notch using said derivative of said curve; and
calculating the location of said apex of said notch using said mid-point and said offset error.

42. The apparatus of claim 41, wherein the curve fitted to said data set includes a peak representing said notch and said derivative of said curve includes peaks on both sides of the peak representing said notch, wherein said instructions for determining the mid-point of said notch include calculating the mid-point between said peaks of said derivative curve.

43. The apparatus of claim 42, wherein each of said peaks of said derivative curve has an amplitude, wherein said instructions for determining the offset error of said apex of said notch comprises calculating the difference in amplitudes of said peaks of said derivative curve.

44. The apparatus of claim 43, wherein said computer program further includes instructions for:
scaling the amplitude of said derivative of said curve;
scaling said angular position of said substrate; and
wherein said instructions for determining the offset error further includes modifying said difference in amplitudes of said peaks of said derivative curve with the scaling factor for said angular position of said substrate.

45. An apparatus comprising:
a light source for producing light that will be at least partially incident on said periphery of said substrate;
a light detector positioned to detect said light, said light detector converts the detected light to an output signal;
a processor coupled to said light detector, said processor receiving and recording said output signal of said light detector relative to the angular position of said substrate; and
a computer program executed by said processor, wherein said computer program includes instructions for:
fitting a curve to the data set of the recorded output signals of said light detector relative to the angular position of said substrate;
determining the center offset of said substrate relative to said axis of rotation of said rotary chuck using the curve fitted to the data set; and
determining the coordinate of a position on said substrate using said center offset as a correction vector.

46. The apparatus of claim 45, wherein said computer program further includes instructions for:
eliminating data representing said notch from said data set and interpolating replacement data points before fitting a curve to said data set; and
eliminating data representing said rotary chuck from said data set and interpolating replacement data points before fitting a curve to said data set.

47. The apparatus of claim 45, wherein said instructions for determining the center offset comprises using the amplitude and the phase of said fitted curve.

* * * * *